United States Patent
Wang et al.

(10) Patent No.: US 6,713,338 B2
(45) Date of Patent: Mar. 30, 2004

(54) METHOD FOR FABRICATING SOURCE/DRAIN DEVICES

(75) Inventors: Wen-Tsung Wang, Taipei (TW);
Yi-Tsung Jan, Taipei (TW); Sung-Min Wei, Hsinchu (TW); Chih-Cherng Liao, Hsinchu (TW); Zhe-Xiong Wu, Hualien (TW); Mao-Tsung Chen, Taoyuan Shiang (TW); Yuan-Heng Li, Taipei (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 10/315,992

(22) Filed: Dec. 11, 2002

(65) Prior Publication Data

US 2004/0038484 A1 Feb. 26, 2004

(30) Foreign Application Priority Data

Feb. 22, 2002 (TW) ........................ 91118973 A

(51) Int. Cl.$^7$ ..................................... H01L 21/8238
(52) U.S. Cl. ..................... 438/231; 438/224; 438/227
(58) Field of Search ............................. 438/231, 227, 438/224, 268, 228, 209, 258

(56) References Cited

U.S. PATENT DOCUMENTS

| | | | | |
|---|---|---|---|---|
| 5,744,372 A | * | 4/1998 | Bulucea | 438/231 |
| 5,920,774 A | * | 7/1999 | Wu | 438/224 |
| 5,952,699 A | * | 9/1999 | Yamazaki et al. | 257/404 |
| 6,078,082 A | * | 6/2000 | Bulucea | 257/345 |
| 6,127,700 A | * | 10/2000 | Bulucea | 257/335 |
| 6,207,484 B1 | * | 3/2001 | Kim et al. | 438/209 |
| 6,274,430 B1 | * | 8/2001 | Jan et al. | 438/258 |
| 6,350,641 B1 | * | 2/2002 | Yang | 438/227 |
| 6,426,258 B1 | * | 7/2002 | Harada et al. | 438/268 |
| 6,576,966 B1 | * | 6/2003 | Bulucea | 257/408 |

* cited by examiner

Primary Examiner—John F. Niebling
Assistant Examiner—Walter Lindsay, Jr.
(74) Attorney, Agent, or Firm—Birch, Stewart, Kolasch & Birch, LLP

(57) ABSTRACT

A method for fabricating source/drain devices. A semiconductor substrate is provided with a gate formed thereon, a first doped area is formed on a first side of the gate on the semiconductor substrate, and a second doped area is formed on a second side of the gate on the semiconductor substrate in a manner such that the second doped area is separated from the gate by a predetermined distance. A patterned photo resist layer is formed on the semiconductor substrate having an opening on the second side, the exposed gate less than half the width of the gate. The semiconductor substrate is implanted and annealed to form a dual diffusion area on the second side of the gate using the patterned photo resist layer as a mask.

18 Claims, 12 Drawing Sheets

METHOD FOR FABRICATING SOURCE/ DRAIN DEVICES

BACKGROUND OF THE INVENTION

1. Field of the Invention

The invention relates to a semiconductor process, and more particularly to a source/drain (S/D) device fabricated process used in a high voltage circuit element.

2. Description of the Related Art

FIGS. 1a to 1i are cross-sections of the conventional method for fabricating S/D device.

In FIG. 1a, a semiconductor substrate 101, such as silicon, is provided, and a first isolating area 105a and a second isolating area 105b are formed thereon. A pad layer 102, such as oxide, a conductive layer 103, such as poly, and a first patterned photo resist layer 104 are sequentially formed in the area between the first isolating area 105a and the second isolating area 105b. The area surrounding the isolating area areas is an active area (AA).

In FIG. 1b, after the conductive layer 103 is etched using the first patterned photo resist layer 104 as a mask to form a gate 103a, the first patterned photo resist layer 104 is removed. Then, the area of the semiconductor substrate 101 between the gate 103a and the first isolating area 105a is doped to form a lightly doped area 106.

In FIG. 1c, an isolating layer 107, such as nitride, is conformably formed on the surface of the pad layer 102 and the gate 103a.

In FIG. 1d, the isolating layer 107 is isotropically etched to form a spacer 107a on the sidewall of the gate 103a.

In FIG. 1e, a second patterned photo resist layer 108 having a first opening 109a and a second opening 109b is formed on the semiconductor substrate 110. The first opening 109a is positioned in the area between the gate 103a and the first isolating area 105a, and the second opening 109b is positioned in the area between the gate 103a and the second isolating area 105b.

First ion implantation is performed on the semiconductor substrate 101 using the second patterned photo resist layer 108 as a mask with As or B ions.

FIG. 2 is a top view of FIG. 1e. In FIG. 2, part of the active area and half the width of the gate 103a are exposed by the first opening 109a in the second patterned photo resist layer 108.

In FIG. 1f, a first doped area 110a is formed at the bottom of the first opening 109a and a second doped area 110b is formed at the bottom of the second opening 109b. After the first ion implantation, the second patterned photo resist layer 108 is removed.

In FIG. 1g, a third patterned photo resist layer 111 having a third opening 112 is formed on the semiconductor substrate 101, and half the width of the gate 103a is exposed by the third opening 112 in the third patterned photo resist layer 111. The third opening 112 is positioned in the area between the gate 103a and the second isolating area 105b.

Second ion implantation is performed on the semiconductor substrate 101 using the third patterned photo resist layer 111 as a mask and the semiconductor substrate 101 is annealed with As or B ions.

FIG. 3 is a top view of FIG. 1f. In FIG. 3, part of the active area and half the width of the gate 103a are exposed by the first opening 112 in the third patterned photo resist layer 111, and the area between the gate 103a and the first isolating 105a is covered with the third patterned photo resist layer 111.

In FIG. 1h, a deeply doped area 113 is formed at the bottom of the third opening 112. After the second ion implantation, the third patterned photo resist layer 111 is removed. The deeply doped area 113 is 6–7 times the depth of the first doped area 110a and the second doped area 1ob. The deeply doped area 113 expands after annealing, such that the depth and the width of the deeply doped area 113 are both increased. When the deeply doped area 113 increases, the concentration of dopant inside the deeply doped area 113 decreases and the breakdown voltage of the deeply doped area 113 increases accordingly.

By varying the energy of the ions to form the deeply doped area 113 in the semiconductor substrate 101, implantation depth into the substrate can be controlled. Meanwhile, the ions also penetrate the gate 103a and the spacer 107a into the semiconductor substrate 101, and the size increases after annealing.

The channel between the S/D consisting of the first doped area 110a and another S/D consisting of the second doped area 110b and deeply doped area 113 is decreased, resulting in Short Channel Effect. When the two S/D devices are both deeply doped areas, the channel between the S/D devices below the gate 103a and spacer 107a punches through, such that electrons are injected into the channel from source region before applying a gate voltage.

SUMMARY OF THE INVENTION

The present invention is directed to a method for fabricating source/drain devices in a high voltage circuit element without additional process.

Accordingly, the present invention provides a method for fabricating a source/drain device, in which, first, a semiconductor substrate having a gate is provided. A first doped area is positioned on a first side of the gate on the semiconductor substrate, and a second doped area is positioned on a second side of the gate on the semiconductor substrate with spaces between. A patterned photo resist layer having an opening on the second side of the gate is formed on the semiconductor substrate, and the exposed gate is less than half the width of the gate. The semiconductor substrate is implanted and annealed to form a dual diffusion area on the second side of the gate using the patterned photo resist layer as a mask.

Accordingly, the present invention also provides a method for fabricating source/drain devices. A silicon substrate having a gate is provided. A first doped area is positioned on a first side of the gate on the silicon substrate, and a second doped area is positioned on a second side of the gate on the silicon substrate with spaces between. A patterned photo resist layer having an opening on the second side of the gate is formed on the semiconductor substrate, and the width of the exposed gate is 2 μm. The silicon substrate is implanted and annealed to form a dual diffusion area on the second side of the gate using the patterned photo resist layer as a mask.

Accordingly, the present invention also provides a method for fabricating a source/drain device. A semiconductor substrate having a pad layer, a gate, a first isolating area and a second isolating area, is provided. The first isolating area is positioned on a first side of the gate and the second isolating area is positioned on a second side of the gate. The gate has a spacer on the sidewall of the gate. A first patterned photo resist layer is formed as a mask to implant into the semiconductor substrate to form a first doped area and a second doped area. The first doped area is positioned between the gate and the first isolating area, and the second doped area is positioned between the gate and second isolating area. A second patterned photo resist layer having an opening on the second side between the gate and the second isolating area is formed on the semiconductor substrate. The exposed gate is less than half the width of the gate. The semiconductor substrate is implanted and annealed using the patterned photo resist layer as a mask to form a dual diffusion area on the second side of the gate. The second patterned photo resist layer is removed.

Accordingly, the present invention also provides a method for fabricating a source/drain device. A silicon substrate having a pad oxide layer, a gate, a first isolating area positioned on a first side of the gate and a second isolating area positioned on a second side of the gate is provided. The gate has a spacer on the sidewall of the gate. A first patterned photo resist layer is formed as a mask to implant the silicon substrate to form a first doped area and a second doped area. The first doped area is positioned between the gate and the first isolating area, and the second doped area is positioned between the gate and second isolating area. The first patterned photo resist layer is removed. A second patterned photo resist layer having an opening on the second side between the gate and the second isolating area is formed on the silicon substrate. The width of the exposed gate is 2 μm. The silicon substrate is implanted and annealed using the patterned photo resist layer as a mask to form a dual diffusion area on the second side of the gate. The second patterned photo resist layer is removed.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 4a to 4i are cross-sections of the method for fabricating S/D device of the present invention.

Figure 1A:
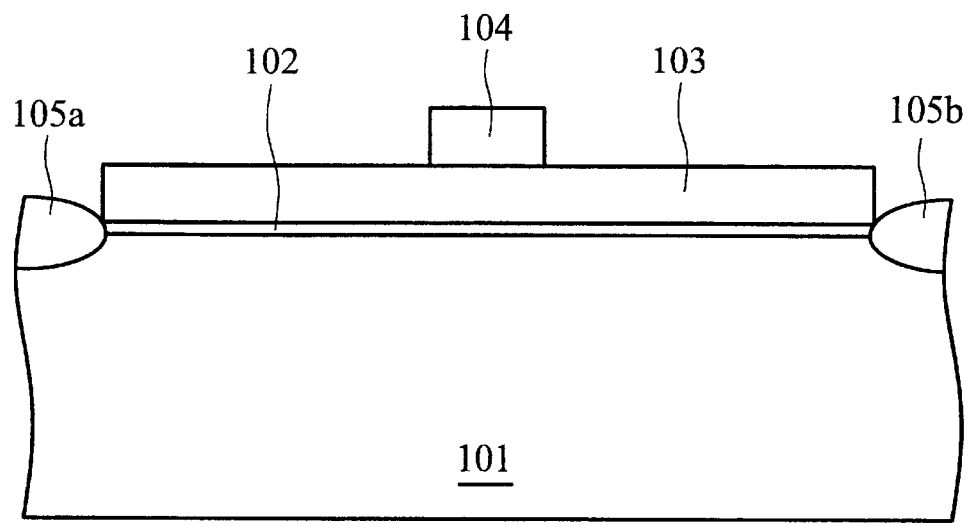
FIGS. 1a to 1i are cross-sections of the conventional method for fabricating S/D device.
Figure 1B:
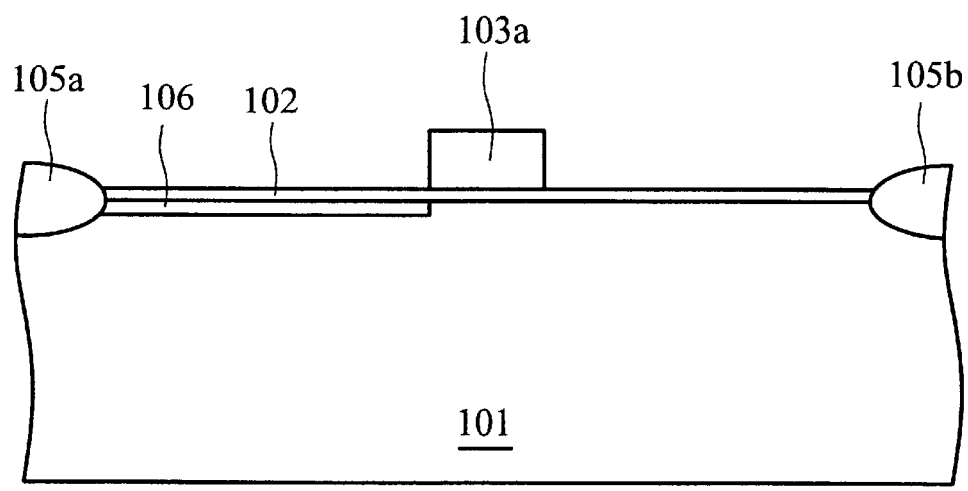
Figure 1C:
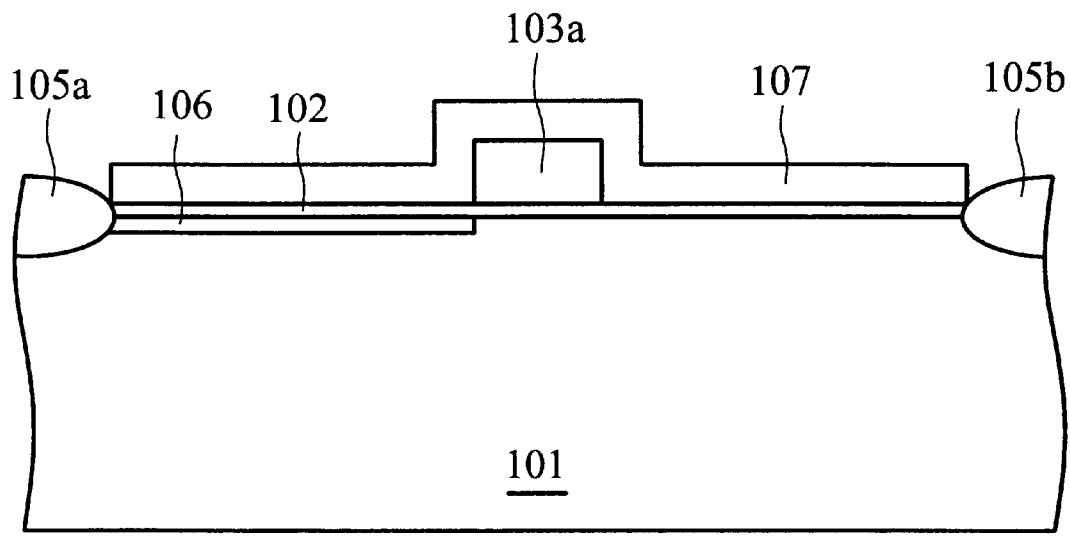
Figure 1D:
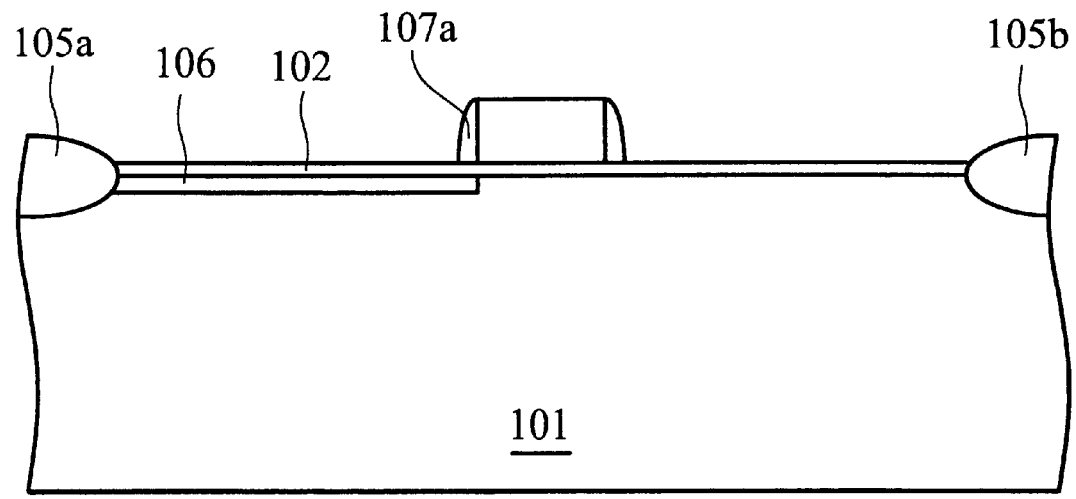
Figure 1E:
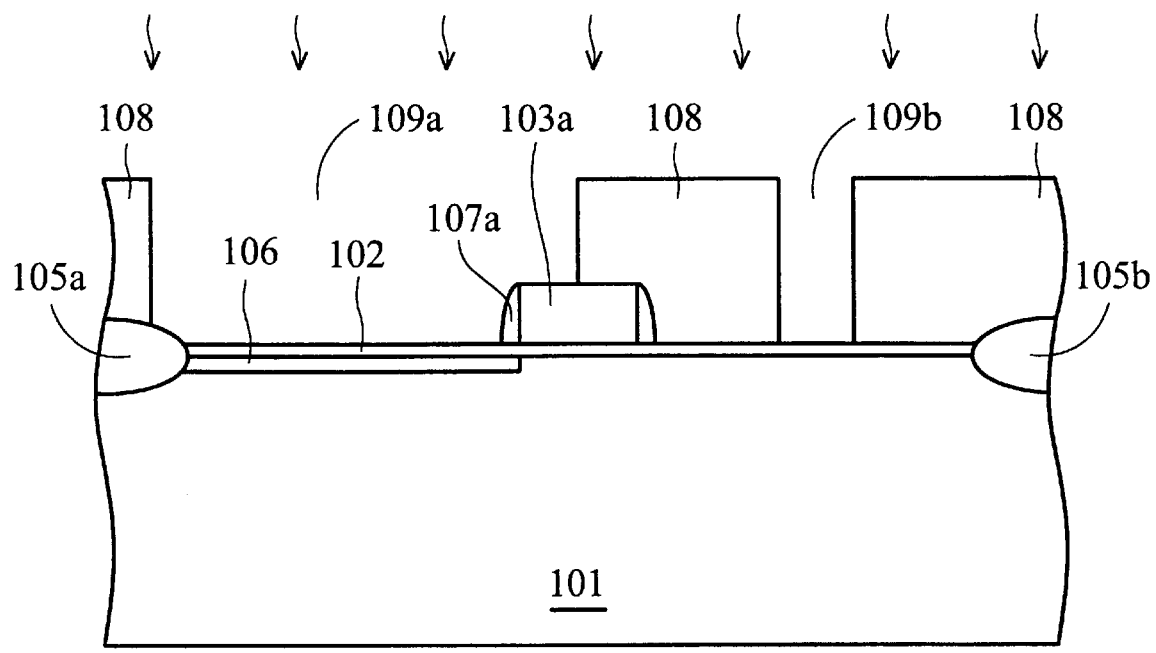
Figure 1F:
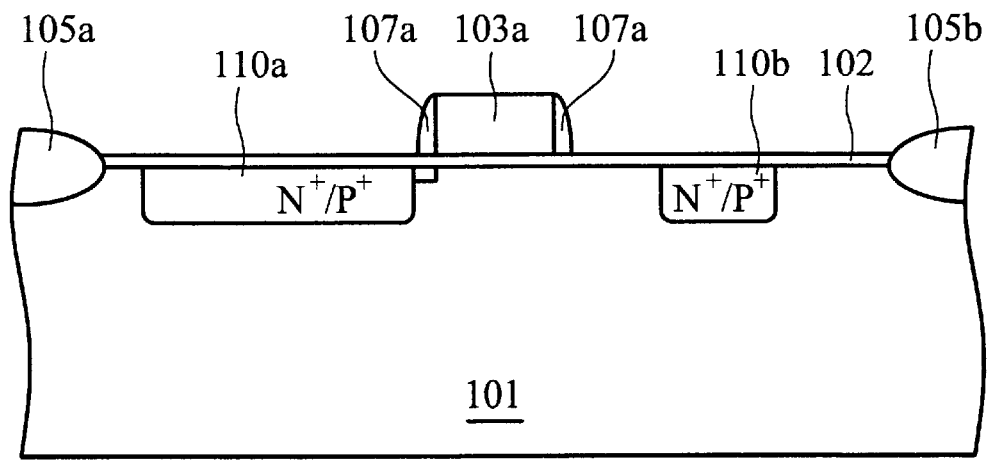
Figure 1G:
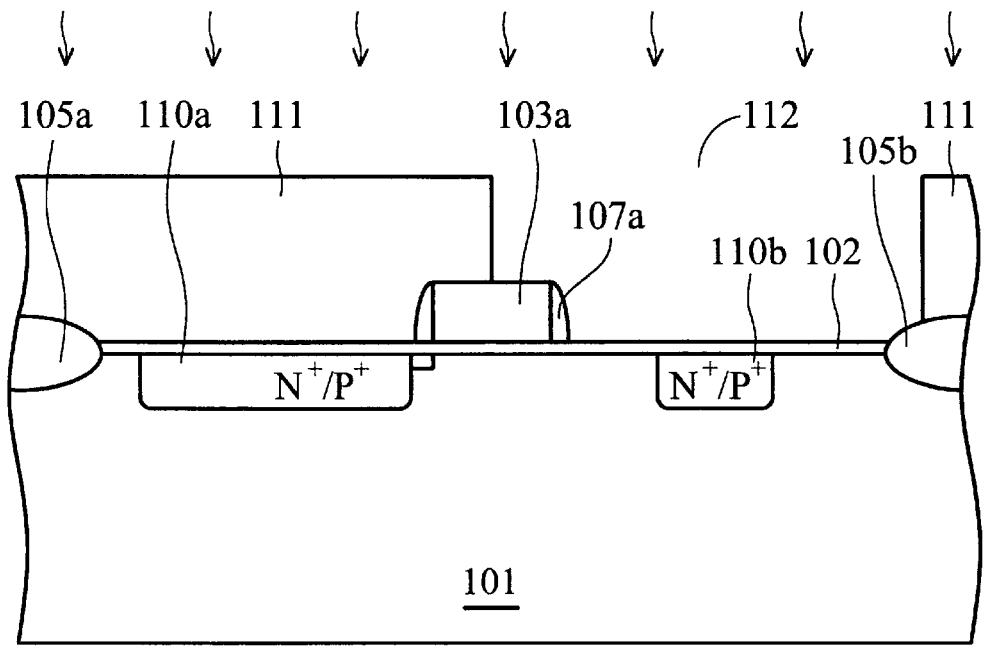
Figure 1H:
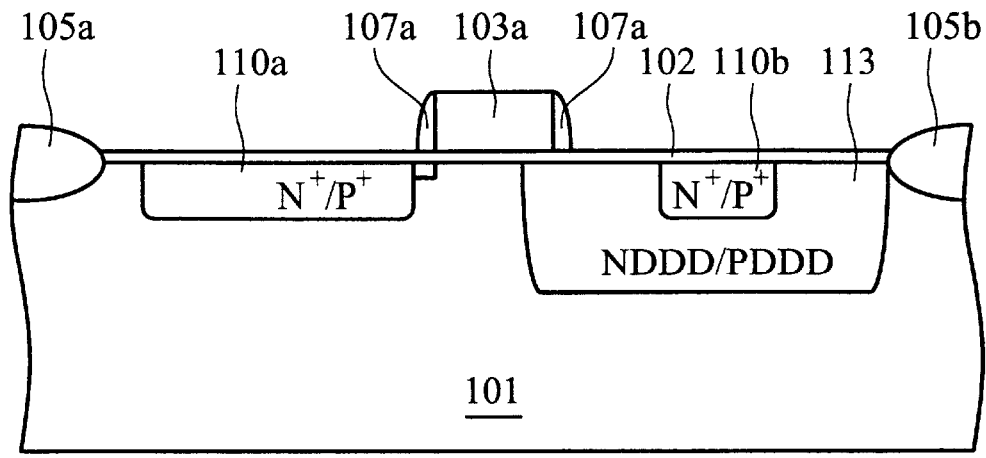
Figure 1I:
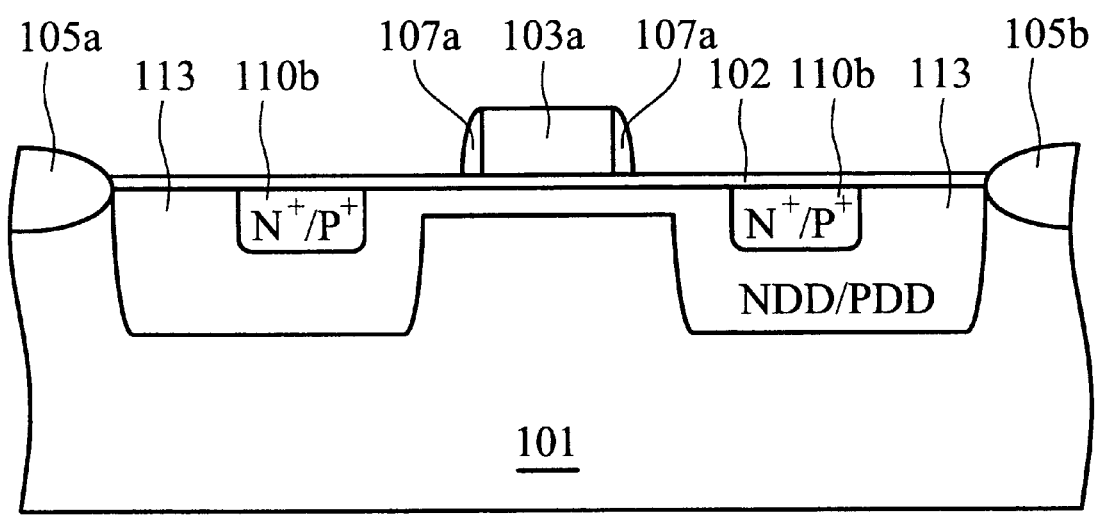
Figure 2:
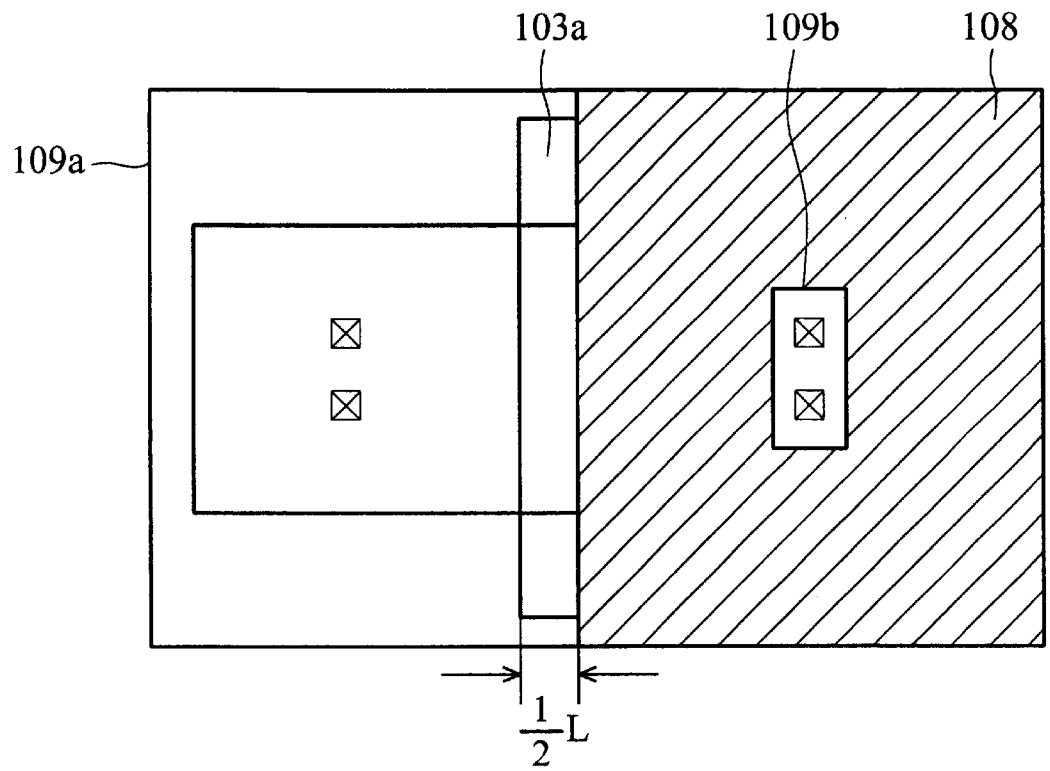
FIG. 2 is a top view of FIG. 1e.
Figure 3:
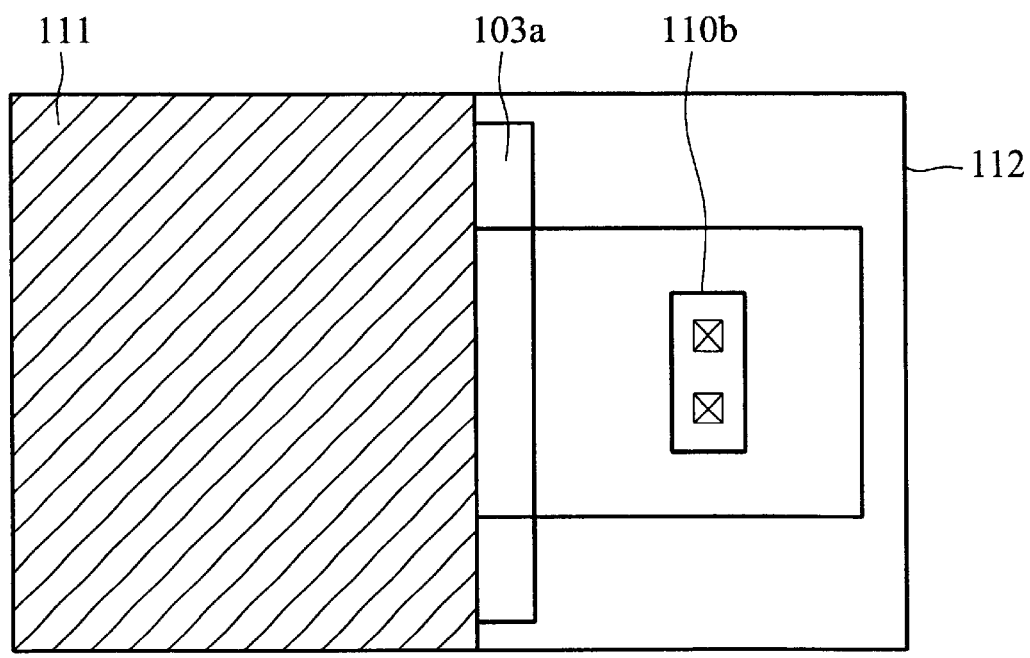
FIG. 3 is a top view of FIG. 1g.
Figure 4A:
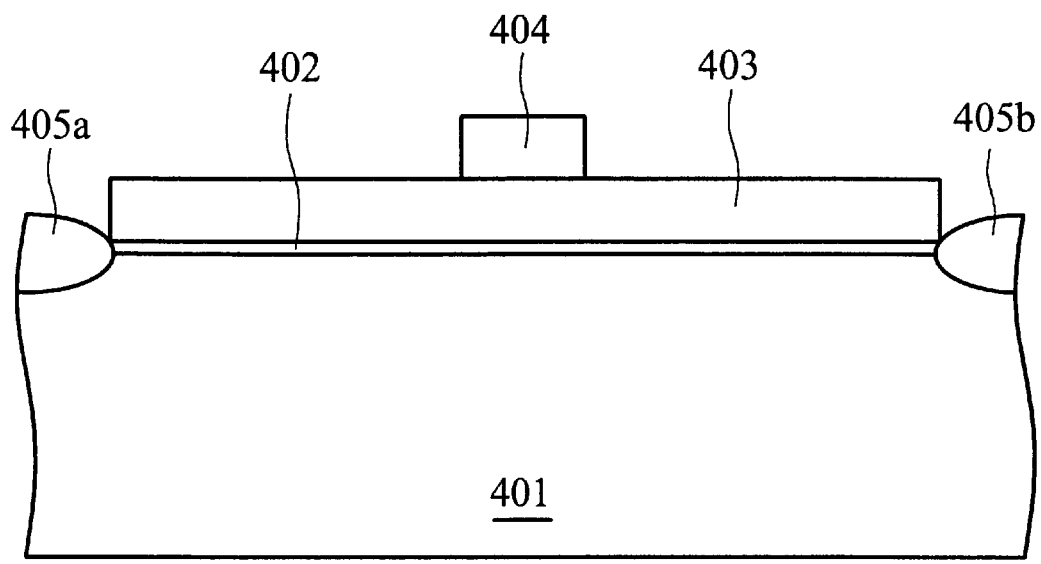
FIGS. 4a to 4i are cross-sections of the method for fabricating S/D device of the present invention.

In FIG. 4a, first, a semiconductor substrate 401, such as silicon, is provided, and a first isolating area 405a and a second isolating area 405b are formed thereon. A pad layer 402, such as oxide, a conductive layer 403, such as poly, and a first patterned photo resist layer 404 are sequentially formed in the area between the first isolating area 405a and the second isolating area 405b. The area surrounding the first isolating area 405a and the second isolating area 405b is an active area (AA).

Figure 4B:
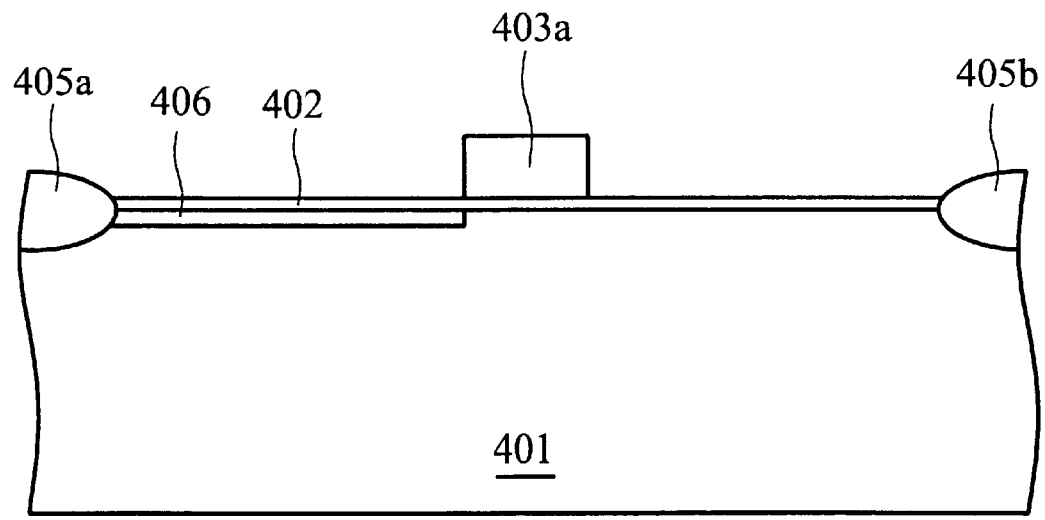

In FIG. 4b, the conductive layer 403 is etched using the first patterned photo resist layer 404 as a mask to form a gate 403a, next, the first patterned photo resist layer 404 is removed and the area of the semiconductor substrate 401 between the gate 403a and the first isolating area 405a is doped to form a lightly doped area 406.

Figure 4C:
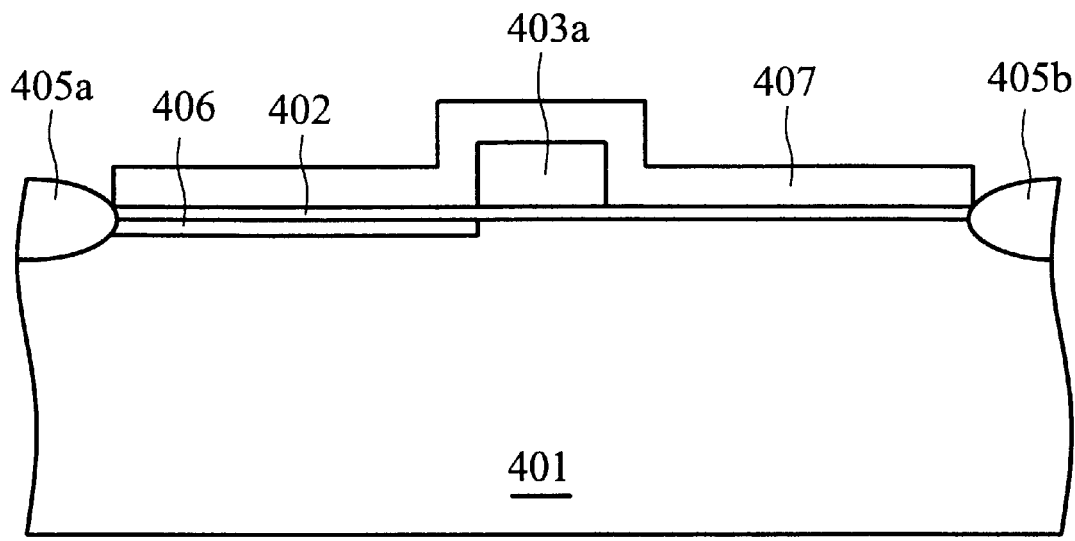

In FIG. 4c, an isolating layer 407, such as nitride, is conformably formed on the surface of the pad layer 402 and the gate 403a.

Figure 4D:
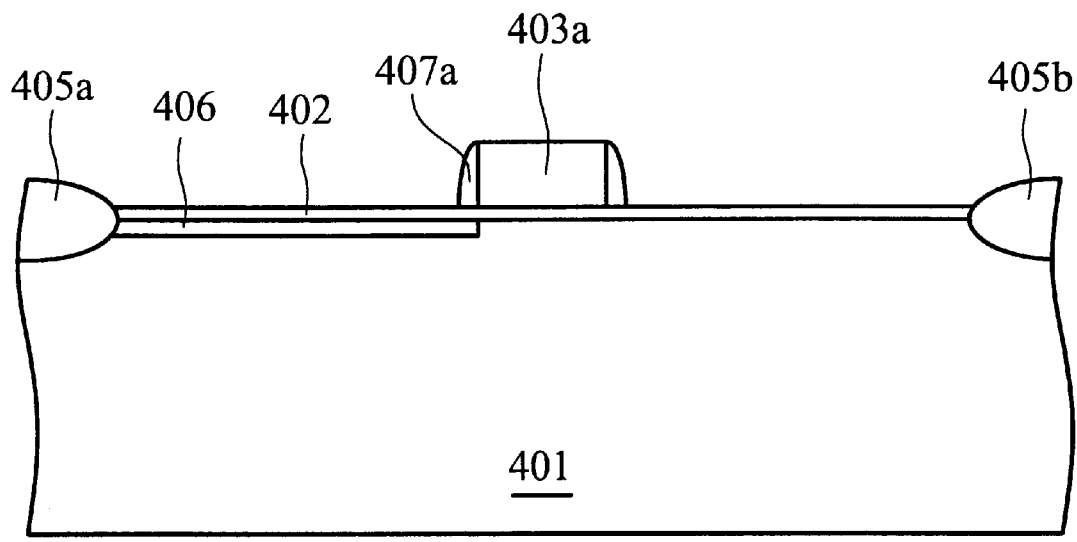

In FIG. 4d, the isolating layer 407 is isotropically etched to form a spacer 407a on the sidewall of the gate 403a.

Figure 4E:
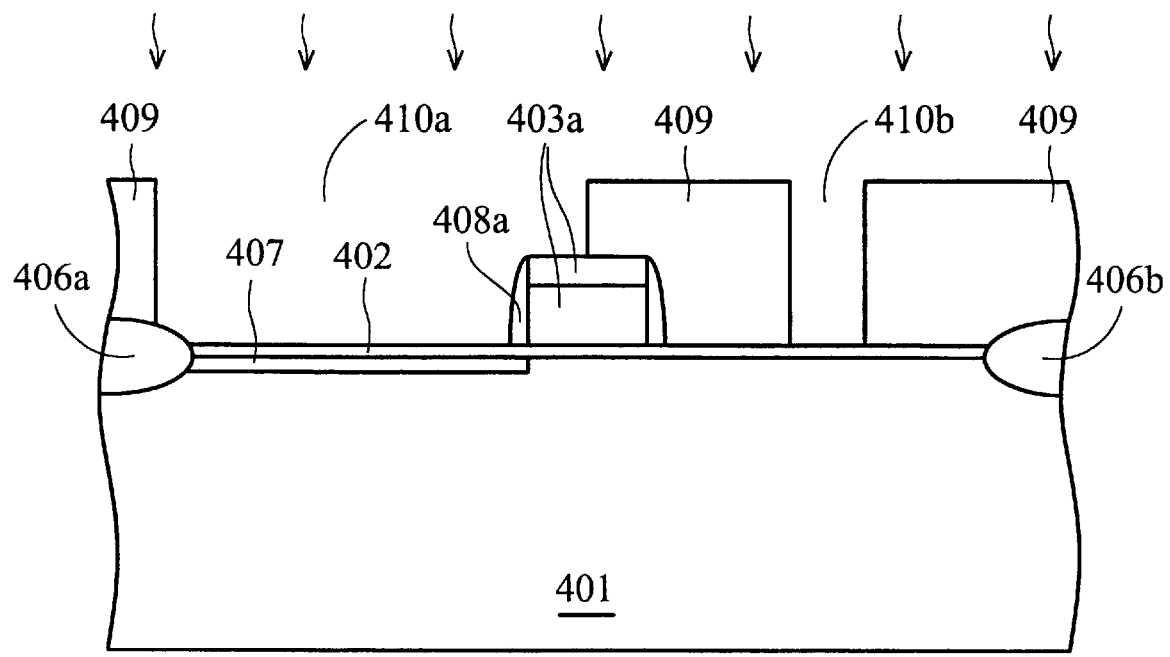

In FIG. 4e, a second patterned photo resist layer 408 having a first opening 409a and a second opening 409b is formed on the semiconductor substrate 401. The first opening 409a is positioned in the area between the gate 403a and the first isolating area 405a, and the second opening 409b is positioned in the area spaced between the gate 403a and the second isolating area 405b.

Figure 5:
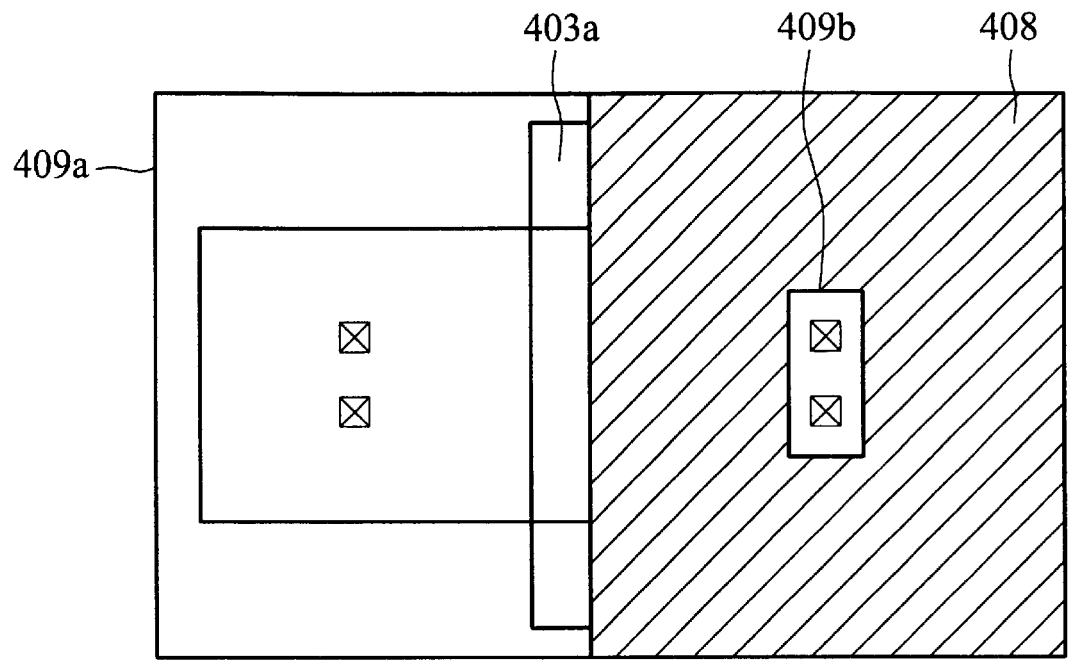
FIG. 5 is a top view of FIG. 4e.

FIG. 5 is a top view of FIG. 4e. In FIG. 5, part of the active area and half the width of the gate 403a are exposed by the first opening 409a in the second patterned photo resist layer 408.

Figure 4F:
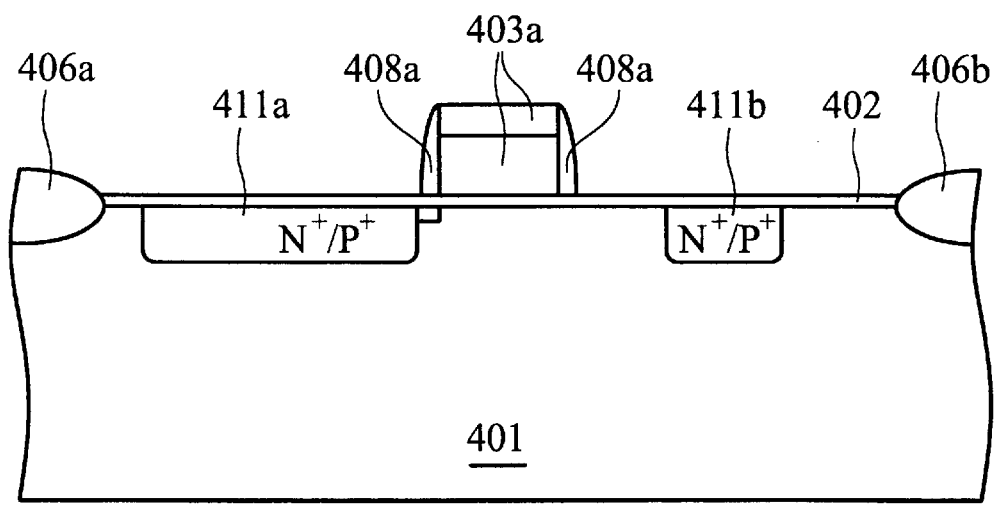

In FIG. 4f, a first doped area 410a is formed at the bottom of the first opening 409a and a second doped area 410b is formed at the bottom of the second opening 409b. After the first ion implantation, the second patterned photo resist layer 408 is removed.

Figure 4G:
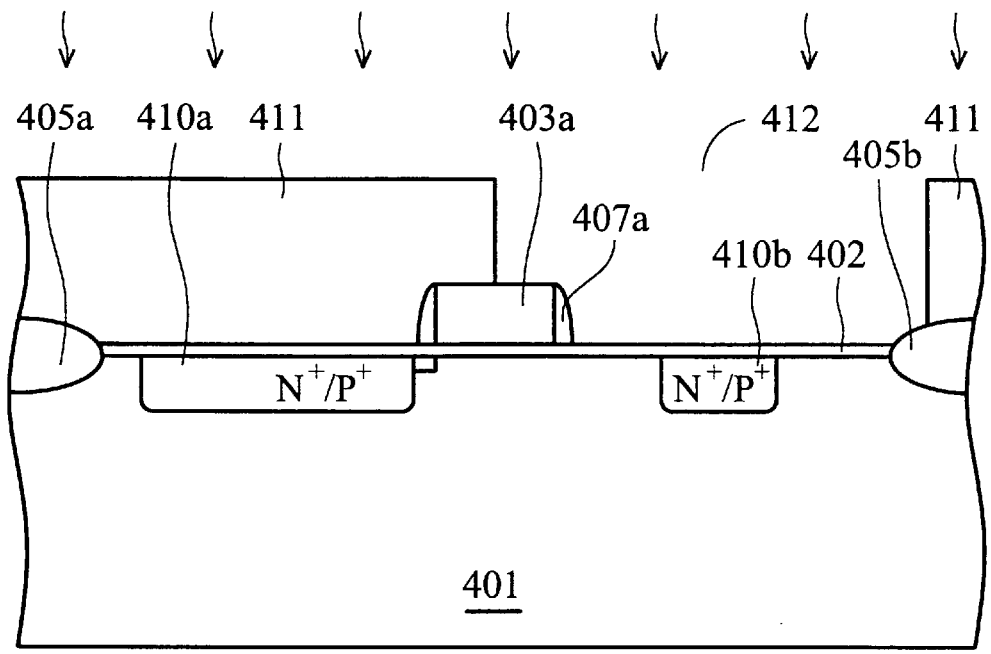

In FIG. 4g, a third patterned photo resist layer 411 having a third opening 412 is formed on the semiconductor substrate 401, and the width of the gate 403a exposing because of the third opening 412 in the third patterned photo resist layer 411 is 2 μm. The third opening 412 is positioned in the area between the gate 403a and the second isolating area 405b.

Second ion implantation is performed on the semiconductor substrate 401 using the third patterned photo resist layer 411 as a mask and the semiconductor substrate 401 is annealed with As or B ions.

Figure 6:
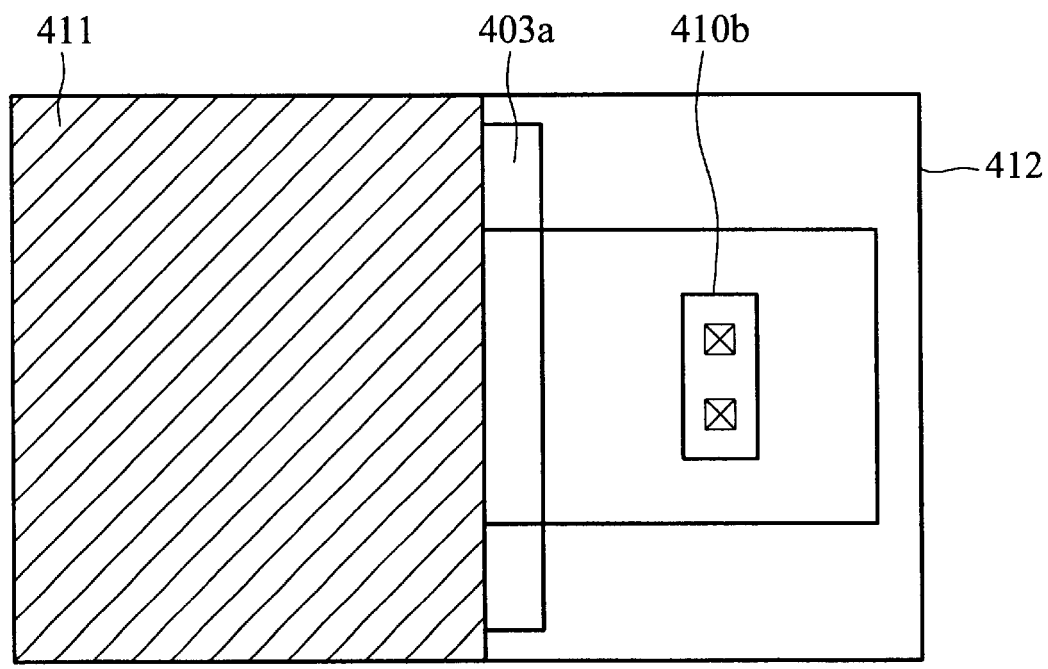
FIG. 6 is a top view of FIG. 4g.

FIG. 6 is a top view of FIG. 4g. In FIG. 4, part of the active area and half the width of the gate 403a are exposed by the 2 μm first opening 412 in the third patterned photo resist layer 411, and the area between the gate 403a and the first isolating 405a is covered with the third patterned photo resist layer 411.

Figure 4H:
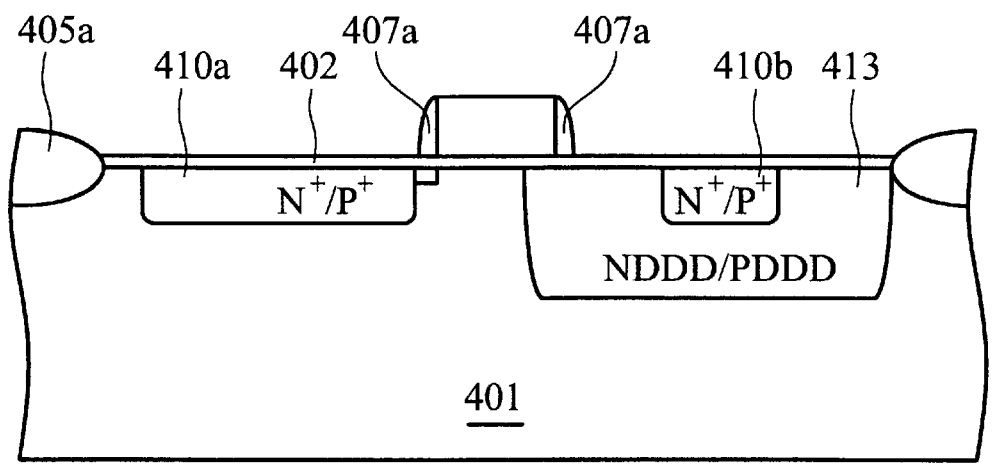
Figure 4I:
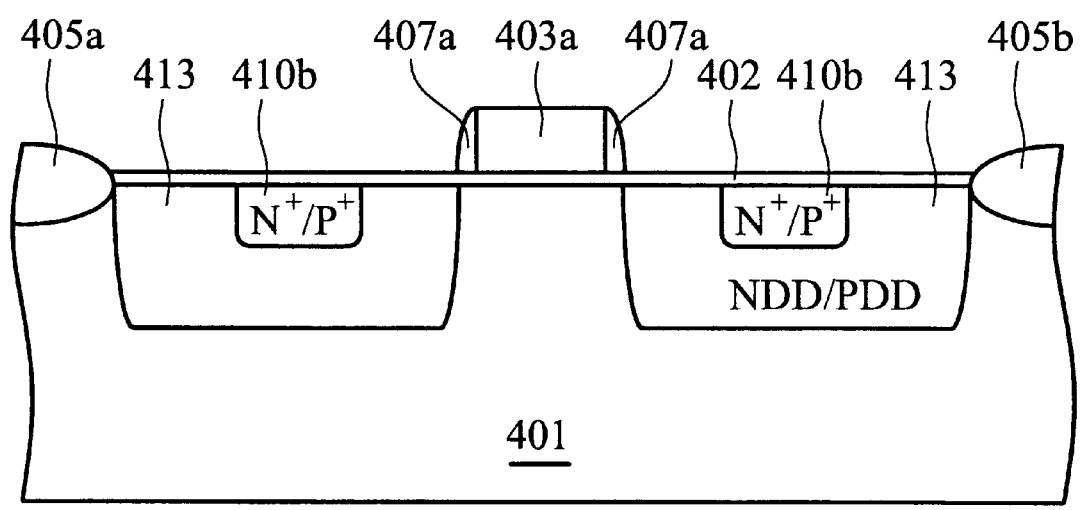

In FIG. 4h, a deeply doped area 413 is formed at the bottom of the third opening 412. After the second ion implantation, the third patterned photo resist layer 411 is removed. The deeply doped area 413 is 6–7 times the depth of the first doped area 410a and the second doped area 410b. The deeply doped area 413 expands after annealing, such that the depth and the width of the deeply doped area 413 are both increased. When the deeply doped area 413 increases, the concentration of dopant inside the deeply doped area 413 decreases and the breakdown voltage of the deeply doped area 413 increases accordingly.

By varying the energy of the ions to form the deeply doped area 413 in the semiconductor substrate 401, the implantation depth into the substrate can be controlled. The ions do not penetrate the gate 403a and the spacer 407a into the semiconductor substrate 401 because of the width of the third opening 412 is only 2 μm, with no increase after annealing.

When the two S/D devices are both deeply doped areas, the channel between the S/D devices below the gate 403a and spacer 407a will not punch through, such that electrons are not injected into the channel from the source region before applying a gate voltage.

The advantage of the present invention is that the channel between the S/D devices below the gate will not punch through, such that the electric field intensity is reduced to avoid the channel short, and breakdown voltage is increased effectively.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating source/drain devices, comprising:

providing a semiconductor substrate having a gate, a first doped area on a first side of the gate on the semiconductor substrate, and a second doped area on a second side of the gate on the semiconductor substrate with spaces between;

forming a patterned photo resist layer on the semiconductor substrate having a opening on the second side of the gate, wherein the exposed gate is less than half the width of the gate; and implanting and annealing the semiconductor substrate to form a dual diffusion area on the second side of the gate using the patterned photo resist layer as a mask.

2. The method for fabricating source/drain devices of claim 1, further comprising a step of removing the patterned photo resist layer.

3. The method for fabricating source/drain devices of claim 1, wherein the semiconductor substrate further comprises a pad layer.

4. The method for fabricating source/drain devices of claim 3, wherein the pad layer is an oxide layer.

5. The method for fabricating source/drain devices of claim 1, wherein the first doped area further comprises a lightly doped area.

6. The method for fabricating source/drain devices of claim 1, wherein the gate has a spacer on the sidewall of the gate.

7. The method for fabricating source/drain devices of claim 1, wherein the width of the exposed gate is 2 $\mu$m.

8. A method for fabricating source/drain devices, comprising:

providing a silicon substrate having a gate, a first doped area on a first side of the gate on the silicon substrate, and a second doped area on a second side of the gate on the silicon substrate with spaces between;

forming a patterned photo resist layer on the semiconductor substrate having a opening on the second side of the gate, wherein the width of the exposed gate is 2 $\mu$m; and implanting and annealing the silicon substrate to form a dual diffusion area on the second side of the gate using the patterned photo resist layer as a mask.

9. The method for fabricating source/drain devices of claim 8, further comprising removing the patterned photo resist layer.

10. The method for fabricating source/drain devices of claim 8, wherein the semiconductor substrate further comprises a pad oxide layer.

11. The method for fabricating source/drain devices of claim 8, wherein the first doped area further comprises a lightly doped area.

12. The method for fabricating source/drain devices of claim 8, wherein the gate has a spacer on the sidewall of the gate.

13. A method for fabricating source/drain devices, comprising:

providing a semiconductor substrate having a pad layer, a gate, a first isolating area on a first side of the gate, and a second isolating area on a second side of the gate, wherein the gate has a spacer on the sidewall of the gate;

forming a first patterned photo resist layer as a mask to implant ions into the semiconductor substrate to form a first doped area and a second doped area, wherein the first doped area is positioned between the gate and the first isolating area, and the second doped area is positioned between the gate and second isolating area;

forming a second patterned photo resist layer on the semiconductor substrate having an opening on the second side between the gate and the second isolating area, wherein the exposed gate is less than half the width of the gate;

implanting and annealing the semiconductor substrate using the patterned photo resist layer as a mask to form a dual diffusion area on the second side of the gate; and removing the second patterned photo resist layer.

14. The method for fabricating source/drain devices of claim 13, wherein the pad layer is an oxide layer.

15. The method for fabricating source/drain devices of claim 13, the first doped area further comprising a lightly doped area.

16. The method for fabricating source/drain devices of claim 13, wherein the width of the exposed gate is 2 $\mu$m.

17. A method for fabricating source/drain devices, comprising:

providing a silicon substrate having a pad oxide layer, a gate, a first isolating area on a first side of the gate, and a second isolating area on a second side of the gate, wherein the gate has a spacer on the sidewall of the gate;

forming a first patterned photo resist layer as a mask to implant the silicon substrate to form a first doped area and a second doped area, wherein the first doped area is positioned between the gate and the first isolating area, and the second doped area is positioned between the gate and second isolating area;

removing the first patterned photo resist layer;

forming a second patterned photo resist layer on the silicon substrate having a opening on the second side between the gate and the second isolating area, wherein the width of the exposed gate is 2 $\mu$m;

implanting and annealing the silicon substrate using the patterned photo resist layer as a mask to form a dual diffusion area on the second side of the gate; and removing the second patterned photo resist layer.

18. The method for fabricating source/drain devices of claim 17, the first doped area further comprising a lightly doped area.

* * * * *